(12) United States Patent
Saigusa et al.

(10) Patent No.: US 8,118,936 B2
(45) Date of Patent: *Feb. 21, 2012

(54) METHOD AND APPARATUS FOR AN IMPROVED BAFFLE PLATE IN A PLASMA PROCESSING SYSTEM

(75) Inventors: Hidehito Saigusa, Nirasaki (JP); Taira Takase, Nirasaki (JP); Kouji Mitsuhashi, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1115 days.

This patent is subject to a terminal disclaimer.

(21) Appl. No.: 11/620,334

(22) Filed: Jan. 5, 2007

(65) Prior Publication Data

US 2007/0107846 A1 May 17, 2007

Related U.S. Application Data

(63) Continuation of application No. 10/259,380, filed on Sep. 30, 2002, now Pat. No. 7,166,166.

(51) Int. Cl.
*H01L 21/00* (2006.01)
*C23C 16/00* (2006.01)
*C23C 14/00* (2006.01)

(52) U.S. Cl. ........ 118/715; 118/724; 118/728; 118/725; 156/345.51

(58) Field of Classification Search .............. 118/715, 118/728, 724; 156/345.51
See application file for complete search history.

(56) References Cited

U.S. PATENT DOCUMENTS

| | | |
|---|---|---|
| 4,310,390 A | 1/1982 | Bradley et al. |
| 4,357,387 A | 11/1982 | George et al. ............... 442/71 |
| 4,469,619 A | 9/1984 | Ohno et al. |
| 4,593,007 A | 6/1986 | Novinski |
| 4,612,077 A | 9/1986 | Tracy et al. |
| 4,649,858 A | 3/1987 | Sakai et al. |
| 4,842,683 A | 6/1989 | Cheng et al. |
| 4,877,757 A | 10/1989 | York et al. |
| 5,000,113 A | 3/1991 | Wang et al. |
| 5,074,456 A | 12/1991 | Degner et al. |
| 5,126,102 A | 6/1992 | Takahashi et al. |
| 5,180,467 A | 1/1993 | Cook et al. |
| 5,302,465 A | 4/1994 | Miller et al. |
| 5,334,462 A | 8/1994 | Vine et al. |
| 5,362,335 A | 11/1994 | Rungta |
| 5,366,585 A | 11/1994 | Robertson et al. |
| 5,367,838 A | 11/1994 | Visaisouk et al. |

(Continued)

FOREIGN PATENT DOCUMENTS

DE 94 21 671 7/1996

(Continued)

OTHER PUBLICATIONS

Yousha Gitjutsu Handbook, 1$^{st}$ Edition, Japan Thermal Spraying Society, Techno Consultants, Inc., pp. 3, 316-317 (1998) (with partial English translation).

(Continued)

*Primary Examiner* — Ram N. Kackar
(74) *Attorney, Agent, or Firm* — Oblon, Spivak, McClelland, Maier & Neustadt, L.L.P.

(57) ABSTRACT

The present invention presents an improved baffle plate for a plasma processing system, wherein the design and fabrication of the baffle plate advantageously provides for a uniform processing plasma in the process space with substantially minimal erosion of the baffle plate.

26 Claims, 9 Drawing Sheets

U.S. PATENT DOCUMENTS

| | | | |
|---|---|---|---|
| 5,423,936 A | 6/1995 | Tomita et al. | |
| 5,426,310 A | 6/1995 | Tamada et al. | |
| 5,484,752 A | 1/1996 | Waku et al. | |
| 5,489,449 A | 2/1996 | Umeya et al. | |
| 5,494,713 A | 2/1996 | Ootuki | |
| 5,521,790 A | 5/1996 | Ruckel et al. | 361/234 |
| 5,534,356 A | 7/1996 | Mahulikar et al. | |
| 5,551,190 A | 9/1996 | Yamagishi et al. | |
| 5,556,501 A | 9/1996 | Collins et al. | |
| 5,614,055 A | 3/1997 | Fairbairn et al. | |
| 5,637,237 A | 6/1997 | Oehrlein et al. | |
| 5,641,375 A | 6/1997 | Nitescu et al. | |
| 5,651,723 A | 7/1997 | Bjornard et al. | |
| 5,680,013 A | 10/1997 | Dornfest et al. | |
| 5,725,960 A | 3/1998 | Konishi et al. | |
| 5,759,360 A | 6/1998 | Ngan et al. | |
| 5,798,016 A | 8/1998 | Oehrlein et al. | |
| 5,820,723 A | 10/1998 | Benjamin et al. | |
| 5,834,070 A | 11/1998 | Movchan et al. | |
| 5,851,343 A | 12/1998 | Hsu et al. | |
| 5,868,848 A | 2/1999 | Tsukamoto | |
| 5,879,575 A | 3/1999 | Tepman et al. | |
| 5,882,411 A | 3/1999 | Zhao et al. | |
| 5,885,356 A | 3/1999 | Zhao et al. | |
| 5,885,402 A | 3/1999 | Esquibel | 156/345.24 |
| 5,891,253 A | 4/1999 | Wong et al. | |
| 5,891,350 A | 4/1999 | Shan et al. | |
| 5,892,278 A | 4/1999 | Horita | 257/706 |
| 5,894,887 A | 4/1999 | Kelsey et al. | |
| 5,895,586 A | 4/1999 | Kaji et al. | |
| 5,900,064 A | 5/1999 | Kholodenko | |
| 5,902,763 A | 5/1999 | Waku et al. | |
| 5,904,778 A | 5/1999 | Lu et al. | |
| 5,911,852 A | 6/1999 | Katayama et al. | |
| 5,919,332 A | 7/1999 | Koshiishi et al. | |
| 5,925,228 A | 7/1999 | Panitz | 204/484 |
| 5,944,902 A | 8/1999 | Redeker et al. | |
| 5,948,521 A | 9/1999 | Dlugosch et al. | |
| 5,952,054 A | 9/1999 | Sato et al. | |
| 5,952,060 A | 9/1999 | Ravi | |
| 5,955,182 A | 9/1999 | Yasuda et al. | |
| 5,968,377 A | 10/1999 | Yuasa et al. | |
| 5,985,102 A | 11/1999 | Leiphart | |
| 5,994,662 A | 11/1999 | Murugesh | |
| 6,068,729 A | 5/2000 | Shrotriya | 156/345.26 |
| 6,073,449 A | 6/2000 | Watanabe et al. | 62/3.2 |
| 6,079,356 A | 6/2000 | Umotoy et al. | |
| 6,082,444 A | 7/2000 | Harada et al. | |
| 6,096,161 A | 8/2000 | Kim et al. | |
| 6,106,625 A | 8/2000 | Koai et al. | |
| 6,108,189 A | 8/2000 | Weldon et al. | |
| 6,110,287 A | 8/2000 | Arai et al. | |
| 6,120,640 A | 9/2000 | Shih et al. | |
| 6,120,955 A | 9/2000 | Tokutake et al. | |
| 6,123,791 A | 9/2000 | Han et al. | |
| 6,123,804 A | 9/2000 | Babassi et al. | |
| 6,129,808 A | 10/2000 | Wicker et al. | |
| 6,139,983 A | 10/2000 | Ohashi et al. | |
| 6,143,646 A | 11/2000 | Wetzel | |
| 6,170,429 B1 | 1/2001 | Schoepp et al. | |
| 6,176,969 B1 | 1/2001 | Park et al. | |
| 6,178,919 B1 | 1/2001 | Li et al. | |
| 6,182,603 B1 | 2/2001 | Shang et al. | |
| 6,210,486 B1 | 4/2001 | Mizukami et al. | |
| 6,221,202 B1 | 4/2001 | Walko, II | |
| 6,246,479 B1 | 6/2001 | Jung et al. | |
| 6,264,788 B1 | 7/2001 | Tomoyasu et al. | |
| 6,265,757 B1 | 7/2001 | Brady | |
| 6,266,133 B1 | 7/2001 | Miyajima et al. | |
| 6,296,716 B1 | 10/2001 | Haerle et al. | |
| 6,296,740 B1 | 10/2001 | Xie et al. | |
| 6,335,293 B1 | 1/2002 | Luo et al. | |
| 6,364,949 B1 | 4/2002 | Or et al. | |
| 6,368,987 B1 | 4/2002 | Kopacz et al. | |
| 6,373,573 B1 | 4/2002 | Jung et al. | |
| 6,383,333 B1 | 5/2002 | Haino et al. | |
| 6,383,964 B1 | 5/2002 | Nakahara et al. | |
| 6,387,817 B1 | 5/2002 | Buckfeller | |
| 6,394,026 B1 | 5/2002 | Wicker et al. | |
| 6,413,578 B1 | 7/2002 | Stowell et al. | |
| 6,444,083 B1 | 9/2002 | Steger et al. | |
| 6,514,377 B1 | 2/2003 | Morimoto | |
| 6,519,037 B2 | 2/2003 | Jung et al. | |
| 6,527,911 B1 | 3/2003 | Yen et al. | |
| 6,533,910 B2 | 3/2003 | O'Donnell et al. | |
| 6,537,429 B2 | 3/2003 | O'Donnell et al. | |
| 6,544,380 B2 | 4/2003 | Tomoyasu et al. | |
| 6,554,906 B1 | 4/2003 | Kuibira et al. | |
| 6,562,186 B1 | 5/2003 | Saito et al. | 156/345.24 |
| 6,570,654 B2 | 5/2003 | Jung et al. | |
| 6,583,064 B2 | 6/2003 | Wicker et al. | |
| 6,590,660 B2 | 7/2003 | Jung et al. | |
| 6,613,204 B2 | 9/2003 | Xie et al. | |
| 6,613,442 B2 | 9/2003 | O'Donnell et al. | |
| 6,632,549 B1 | 10/2003 | Ohashi et al. | |
| 6,641,697 B2 | 11/2003 | Han et al. | |
| 6,663,714 B2 | 12/2003 | Mizuno et al. | |
| 6,695,929 B2 | 2/2004 | Kanekiyo et al. | |
| 6,724,140 B2 | 4/2004 | Araki | |
| 6,726,801 B2 | 4/2004 | Ahn | |
| 6,733,620 B1 | 5/2004 | Sugiyama et al. | |
| 6,738,862 B1 | 5/2004 | Ross et al. | |
| 6,771,483 B2 | 8/2004 | Harada et al. | |
| 6,776,873 B1 | 8/2004 | Sun et al. | |
| 6,783,863 B2 | 8/2004 | Harada et al. | |
| 6,783,875 B2 | 8/2004 | Yamada et al. | |
| 6,798,519 B2 | 9/2004 | Nishimoto et al. | |
| 6,805,952 B2 | 10/2004 | Chang et al. | |
| 6,806,949 B2 | 10/2004 | Ludviksson et al. | |
| 6,811,651 B2 | 11/2004 | Long | |
| 6,830,622 B2 | 12/2004 | O'Donnell et al. | |
| 6,833,279 B2 | 12/2004 | Choi | |
| 6,837,966 B2 | 1/2005 | Nishimoto et al. | |
| 6,852,433 B2 | 2/2005 | Maeda | |
| 6,863,594 B2 | 3/2005 | Preising | |
| 6,875,477 B2 | 4/2005 | Trickett et al. | |
| 6,884,516 B2 | 4/2005 | Harada et al. | |
| 6,894,769 B2 | 5/2005 | Ludviksson et al. | |
| 6,896,785 B2 | 5/2005 | Shatrov et al. | |
| 7,137,353 B2 | 11/2006 | Saigusa et al. | |
| 7,147,749 B2 | 12/2006 | Nishimoto et al. | |
| 7,163,585 B2 | 1/2007 | Nishimoto et al. | |
| 7,166,166 B2 | 1/2007 | Saigusa et al. | |
| 7,166,200 B2 | 1/2007 | Saigusa et al. | |
| 7,204,912 B2 | 4/2007 | Saigusa et al. | |
| 7,282,112 B2 | 10/2007 | Nishimoto et al. | |
| 7,291,566 B2 | 11/2007 | Escher et al. | |
| 7,300,537 B2 | 11/2007 | O'Donnell et al. | |
| 7,311,797 B2 | 12/2007 | O'Donnell et al. | |
| 7,364,798 B2 | 4/2008 | Harada et al. | |
| 2001/0003271 A1 | 6/2001 | Otsuki | |
| 2001/0050144 A1 | 12/2001 | Nishikawa et al. | |
| 2002/0018921 A1 | 2/2002 | Yamada et al. | |
| 2002/0066532 A1 | 6/2002 | Shih et al. | |
| 2002/0076508 A1 | 6/2002 | Chiang et al. | |
| 2002/0086118 A1 | 7/2002 | Chang et al. | |
| 2002/0086501 A1 | 7/2002 | O'Donnell et al. | |
| 2002/0086545 A1 | 7/2002 | O'Donnell et al. | |
| 2002/0086553 A1 | 7/2002 | O'Donnell et al. | |
| 2002/0090464 A1 | 7/2002 | Jiang et al. | |
| 2002/0142611 A1 | 10/2002 | O'Donnell et al. | |
| 2002/0177001 A1 | 11/2002 | Harada et al. | 428/469 |
| 2003/0010446 A1 | 1/2003 | Kajiyama et al. | |
| 2003/0029563 A1 | 2/2003 | Kaushal et al. | |
| 2003/0084848 A1 | 5/2003 | Long | |
| 2003/0113479 A1 | 6/2003 | Fakuda et al. | 427/569 |
| 2003/0150419 A1 | 8/2003 | Daragheh et al. | |
| 2003/0200929 A1 | 10/2003 | Otsuki | |
| 2004/0026372 A1 | 2/2004 | Takenaka et al. | |
| 2004/0035364 A1 | 2/2004 | Tomoyoshi et al. | |
| 2004/0050495 A1 | 3/2004 | Sumiya et al. | |
| 2004/0060516 A1 | 4/2004 | Nishimoto et al. | |
| 2004/0060656 A1 | 4/2004 | Saigusa et al. | |
| 2004/0060657 A1 | 4/2004 | Saigusa et al. | |
| 2004/0060658 A1 | 4/2004 | Nishimoto et al. | |
| 2004/0060661 A1 | 4/2004 | Nishimoto et al. | |
| 2004/0060779 A1 | 4/2004 | Kreger | |

| | | | | | |
|---|---|---|---|---|---|
| 2004/0061447 A1 | 4/2004 | Saigusa et al. | JP | 08-041309 | 2/1996 |
| 2004/0063333 A1 | 4/2004 | Saigusa et al. | JP | 08-081777 | 3/1996 |
| 2004/0072426 A1 | 4/2004 | Jung | JP | 08-268751 | 10/1996 |
| 2004/0081746 A1 | 4/2004 | Imafuku | JP | 08-339895 | 12/1996 |
| 2004/0083970 A1 | 5/2004 | Imafuku et al. | JP | 09-069554 | 3/1997 |
| 2004/0125359 A1 | 7/2004 | Ludviksson et al. | JP | 09-228070 | 9/1997 |
| 2004/0168640 A1 | 9/2004 | Muto et al. | JP | 09-272987 | 10/1997 |
| 2004/0173155 A1 | 9/2004 | Nishimoto et al. | JP | 10-004083 | 1/1998 |
| 2004/0216667 A1 | 11/2004 | Mitsuhashi | JP | 10-045461 | 2/1998 |
| 2005/0103268 A1 | 5/2005 | Nishimoto et al. | JP | 10-045467 | 2/1998 |
| 2005/0103275 A1 | 5/2005 | Sasaki et al. | JP | 10-130884 | 5/1998 |
| 2005/0150866 A1 | 7/2005 | O'Donnell ............ 216/67 | JP | 10-214819 | 8/1998 |
| 2006/0134919 A1 | 6/2006 | Hamelin et al. | JP | 10-226869 | 8/1998 |
| 2007/0026246 A1 | 2/2007 | Harada et al. | JP | 10-251871 | 9/1998 |
| 2007/0028839 A1 | 2/2007 | Saigusa et al. | JP | 11-001757 | 1/1999 |
| 2007/0034337 A1 | 2/2007 | Nishimoto et al. | JP | 11-080925 | 3/1999 |
| 2007/0096658 A1 | 5/2007 | Saigusa et al. | JP | 11-207161 | 8/1999 |
| 2007/0102287 A1 | 5/2007 | Nishimoto et al. | JP | 11-233292 | 8/1999 |
| 2007/0125494 A1 | 6/2007 | Saigusa et al. | JP | 11-310451 | 11/1999 |
| 2007/0142956 A1 | 6/2007 | Escher et al. | JP | 11-312646 | 11/1999 |
| 2007/0204794 A1 | 9/2007 | Nishimoto et al. | JP | 2000-119840 A | 4/2000 |
| 2008/0066647 A1 | 3/2008 | Harada et al. | JP | 2000-124197 | 4/2000 |
| 2008/0069966 A1 | 3/2008 | Otsuki | JP | 2000-303180 | 10/2000 |
| 2008/0070028 A1 | 3/2008 | Harada et al. | JP | 2001-031484 | 2/2001 |
| 2008/0070032 A1 | 3/2008 | Otsuki | JP | 2001-152307 | 6/2001 |
| 2008/0070051 A1 | 3/2008 | Harada et al. | JP | 2001-164354 | 6/2001 |
| | | | JP | 2001-226773 | 8/2001 |
| | FOREIGN PATENT DOCUMENTS | | JP | 2002-134481 | 5/2002 |
| EP | 0326318 | 8/1989 | JP | 2002-151473 | 5/2002 |
| EP | 0 508 731 | 10/1992 | KR | 1991-002451 | 6/1988 |
| EP | 0 573 057 | 12/1993 | KR | 1999-0008937 | 9/1994 |
| EP | 0 814 495 | 6/1997 | KR | 1998-063542 | 10/1998 |
| EP | 0 799 904 | 10/1997 | KR | 1999-008142 | 1/1999 |
| EP | 0 841 838 | 5/1998 | KR | 1999-13565 | 2/1999 |
| EP | 1 069 603 | 1/2001 | KR | 2002-0027373 | 4/2002 |
| EP | 1 081 749 | 7/2001 | KR | 10/2004-0007601 | 1/2004 |
| EP | 1 156 130 | 11/2001 | WO | 99/50886 | 10/1999 |
| GB | 2 252 567 | 8/1992 | WO | 01/42526 | 6/2001 |
| JP | 59-186325 | 10/1984 | WO | 02/39495 | 5/2002 |
| JP | 61-207566 | 9/1986 | WO | 02/48421 | 6/2002 |
| JP | 62-067161 | 3/1987 | WO | 2004/030011 | 4/2004 |
| JP | 63-000450 | 1/1988 | WO | 2004/030012 | 4/2004 |
| JP | 64-039728 | 2/1989 | WO | 2004/030013 | 4/2004 |
| JP | 1-120328 | 8/1989 | WO | 2004/030014 | 4/2004 |
| JP | 1-312087 | 12/1989 | WO | 2004/030015 | 4/2004 |
| JP | 02-267967 | 11/1990 | WO | 2004/030020 | 4/2004 |
| JP | 03-115535 | 5/1991 | WO | 2004/030426 | 4/2004 |
| JP | 4-238882 | 8/1992 | WO | 2004/095530 | 11/2004 |
| JP | 05-070922 | 3/1993 | WO | 2004/095532 | 11/2004 |
| JP | 05-117064 | 5/1993 | WO | WO 2004/095530 | 11/2004 |
| JP | 05-121360 | 5/1993 | WO | WO 2004/095532 | 11/2004 |
| JP | 05-198532 | 8/1993 | | | |
| JP | 05-238855 | 9/1993 | | | |
| JP | 05-238859 | 9/1993 | | | |
| JP | 06-011346 | 2/1994 | | | |
| JP | 06-057396 | 3/1994 | | | |
| JP | 06-136505 | 5/1994 | | | |
| JP | 06-142822 | 5/1994 | | | |
| JP | 06-196548 | 7/1994 | | | |
| JP | 06-256926 | 9/1994 | | | |
| JP | 06-287739 | 10/1994 | | | |
| JP | 07-058013 A | 3/1995 | | | |
| JP | 07-126827 | 5/1995 | | | |
| JP | 07-176524 | 7/1995 | | | |
| JP | 07-226378 | 8/1995 | | | |
| JP | 07-245295 | 9/1995 | | | |
| JP | 08-037180 | 2/1996 | | | |

OTHER PUBLICATIONS

Production drawing for Deposition Shield, Upper believed to be sold in the U.S. on Apr. 12, 2000.

Production drawing for Deposition Shield believed to be sold in the U.S. prior to Sep. 30, 2001.

Production drawing for Upper Electrode believed to be sold in the U.S. prior to Sep. 30, 2001.

JIS Using Series, "Spraying Techniques Manual.", p. 95 (Oct. 30, 1998, Japanese Standard Association), with English Translation.

Kim, Hee Jee, "Plasma-Sprayed Alumina-Yttria Ceramic Coatings for Cavitation-Erosion Protection," Sep. 1989, pp. 139-146.

Notification of Reexamination dated Apr. 14, 2011 issued in CN Patent Application 03822079.2, filed Mar. 17, 2005.

METHOD AND APPARATUS FOR AN IMPROVED BAFFLE PLATE IN A PLASMA PROCESSING SYSTEM

CROSS-REFERENCE TO RELATED APPLICATIONS

This application is a continuation of and claims the benefit of priority under 35 USC §120 from U.S. patent application Ser. No. 10/259,380, filed Sep. 30, 2002, the entire contents of which is incorporated herein by reference. This application is also related to U.S. Pat. No. 7,147,749, entitled "Method and apparatus for an improved upper electrode plate with deposition shield in a plasma processing system", issued on Dec. 12, 2006; U.S. Pat. No. 6,837,966, entitled "Method and apparatus for an improved baffle plate in a plasma processing system", issued on Jan. 4, 2005; and U.S. patent application Ser. No. 10/259,757, entitled "Method and apparatus for an improved upper electrode plate in a plasma processing system", filed on Sep. 30, 2002; U.S. Pat. No. 7,137,353, entitled "Method and apparatus for an improved deposition shield in a plasma processing system", issued on Nov. 21, 2006; U.S. Pat. No. 6,798,519, entitled "Method and apparatus for an improved optical window deposition shield in a plasma processing system", issued on Sep. 28, 2004; and U.S. patent application Ser. No. 10/259,306, entitled "Method and apparatus for an improved bellows shield in a plasma processing system", filed on Sep. 30, 2002. The entire contents of all of those applications are herein incorporated by reference in their entirety.

FIELD OF THE INVENTION

The present invention relates to an improved component for a plasma processing system and, more particularly, to a baffle plate employed in a plasma processing system surrounding a substrate holder.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, components of the plasma processing system, known to sustain exposure to the processing plasma, are coated with a protective barrier. For example, components fabricated from aluminum can be anodized to produce a surface layer of aluminum oxide, which is more resistant to the plasma. In another example, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate.

In both cases, the inevitable failure of the protective coating, either due to the integrity of the protective barrier or the integrity of the fabrication of the protective barrier, and the consumable nature of the replaceable components demands frequent maintenance of the plasma processing system. This frequent maintenance can produce costs associated with plasma processing down-time and new plasma processing chamber components, which can be excessive.

SUMMARY OF THE INVENTION

The present invention provides an improved baffle plate for a plasma processing system, wherein the design and fabrication of the baffle plate advantageously addresses the above-identified shortcomings.

It is an object of the present invention to provide a baffle plate comprising a canted ring having an upper surface, a lower surface, an inner radial edge, and an outer radial edge. The upper surface can further comprise a first mating surface proximate the outer radial edge. The lower surface can further comprise a second mating surface proximate the outer radial edge. The baffle plate can further comprise at least one passageway coupled to the upper surface and to the lower surface, and configured to permit the flow of gas therethrough, wherein the at least one passageway can comprise an inner passageway surface.

It is a further object of the present invention that the exposed surface of the baffle plate comprises the upper surface of the baffle plate excluding the first mating surface; the lower surface of the baffle plate excluding the second mating surface; the inner edge surface; and the inner passageway surface contiguous with the upper surface and the lower surface.

The present invention further provides a method of producing the baffle plate in the plasma processing system comprising the steps: fabricating the baffle plate; anodizing the baffle plate to form a surface anodization layer on the baffle plate; machining exposed surfaces on the baffle plate to remove the surface anodization layer; and forming a protective barrier on the exposed surfaces.

The present invention provides another method of producing the baffle plate in the plasma processing system comprising the steps: fabricating the baffle plate; masking exposed surfaces on the baffle plate to prevent formation of a surface anodization layer; anodizing the baffle plate to form the surface anodization layer on the baffle plate; unmasking the exposed surfaces; and forming a protective barrier on the exposed surfaces.

The present invention provides another method of producing the baffle plate in the plasma processing system comprising the steps: fabricating the baffle plate; and forming a protective barrier on a plurality of exposed surfaces.

The present invention may also include a process of combining machining and masking to prepare the exposed surfaces to receive the protective barrier, and then forming the protective barrier on the exposed surfaces. For example, two of the exposed surfaces can be masked prior to anodizing, and two of the surfaces can be machined after anodizing to create four exposed surfaces on which the protective barrier can be formed.

Any of the above methods may also optionally include machining anodized (or otherwise coated) surfaces that are not exposed surfaces (e.g., to obtain a bare metal connection where the machined surface will mate with another part).

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

The present invention provides an improved baffle plate for a plasma processing system, wherein the design and fabrication of the baffle plate advantageously alleviates the above-identified shortcomings.

Figure 1:
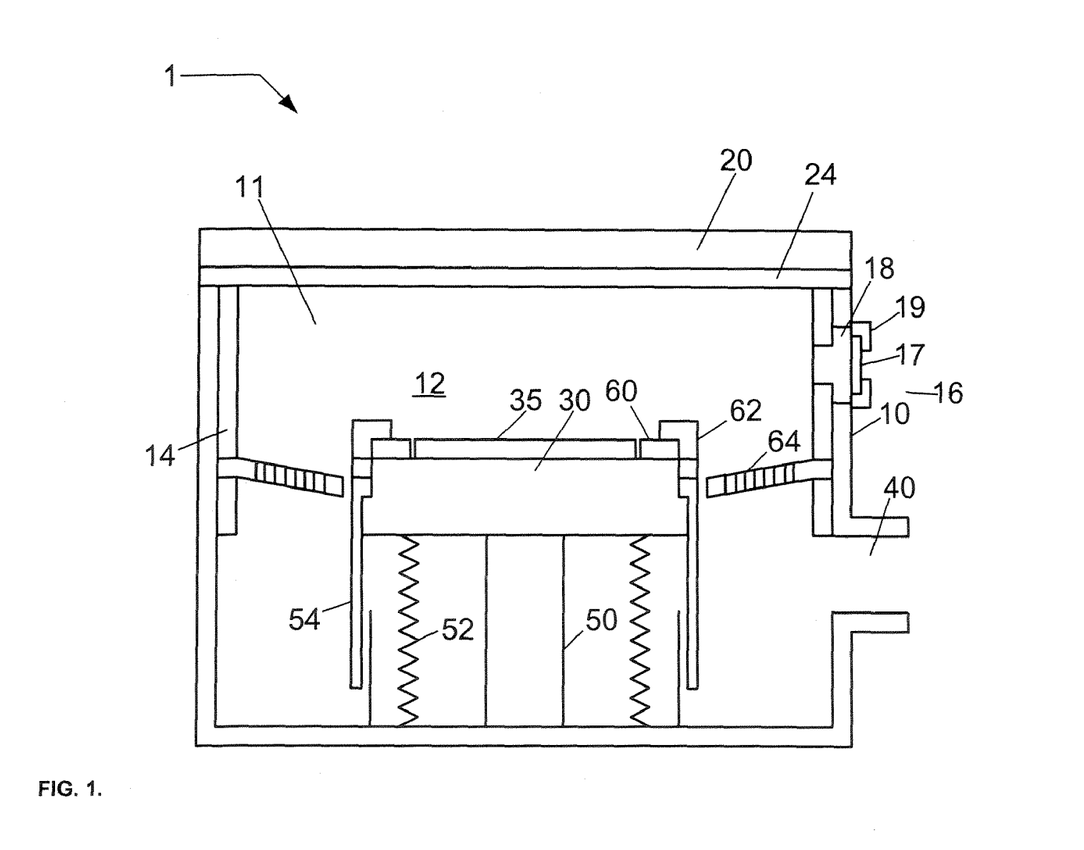
FIG. 1 shows a simplified block diagram of a plasma processing system comprising a baffle plate according to an embodiment of the present invention.

According to an embodiment of the present invention, a plasma processing system 1 is depicted in FIG. 1 comprising a plasma processing chamber 10, an upper assembly 20, an electrode plate 24, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of a processing plasma in process space 12 adjacent substrate 35. The plasma processing system 1 can be configured to process 200 mm substrates, 300 mm substrates, or larger.

In the illustrated embodiment, upper assembly 20 can comprise at least one of a cover, a gas injection assembly, and an upper electrode impedance match network. For example, the electrode plate 24 can be coupled to an RF source, and facilitate an upper electrode for the plasma processing system 1. In another alternate embodiment, the upper assembly 20 comprises a cover and an electrode plate 24, wherein the electrode plate 24 is maintained at an electrical potential equivalent to that of the plasma processing chamber 10. For example, the plasma processing chamber 10, the upper assembly 20, and the electrode plate 24 can be electrically connected to ground potential, and facilitate an upper electrode for the plasma processing system 1.

Plasma processing chamber 10 can, for example, further comprise a deposition shield 14 for protecting the plasma processing chamber 10 from the processing plasma in the process space 12, and an optical viewport 16. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the plasma processing chamber 10. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can, for example, be coupled to the substrate holder 30 and configured to protect the bellows 52 from the processing plasma. Substrate holder 10 can, for example, further be coupled to at least one of a focus ring 60, and a shield ring 62. Furthermore, a baffle plate 64 can extend about a periphery of the substrate holder 30.

Substrate 35 can be, for example, transferred into and out of plasma processing chamber 10 through a slot valve (not shown) and chamber feed-through (not shown) via a robotic substrate transfer system, where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermo-electric heaters/coolers can be included.

In the illustrated embodiment, shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, any combination thereof, and with and without magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2:
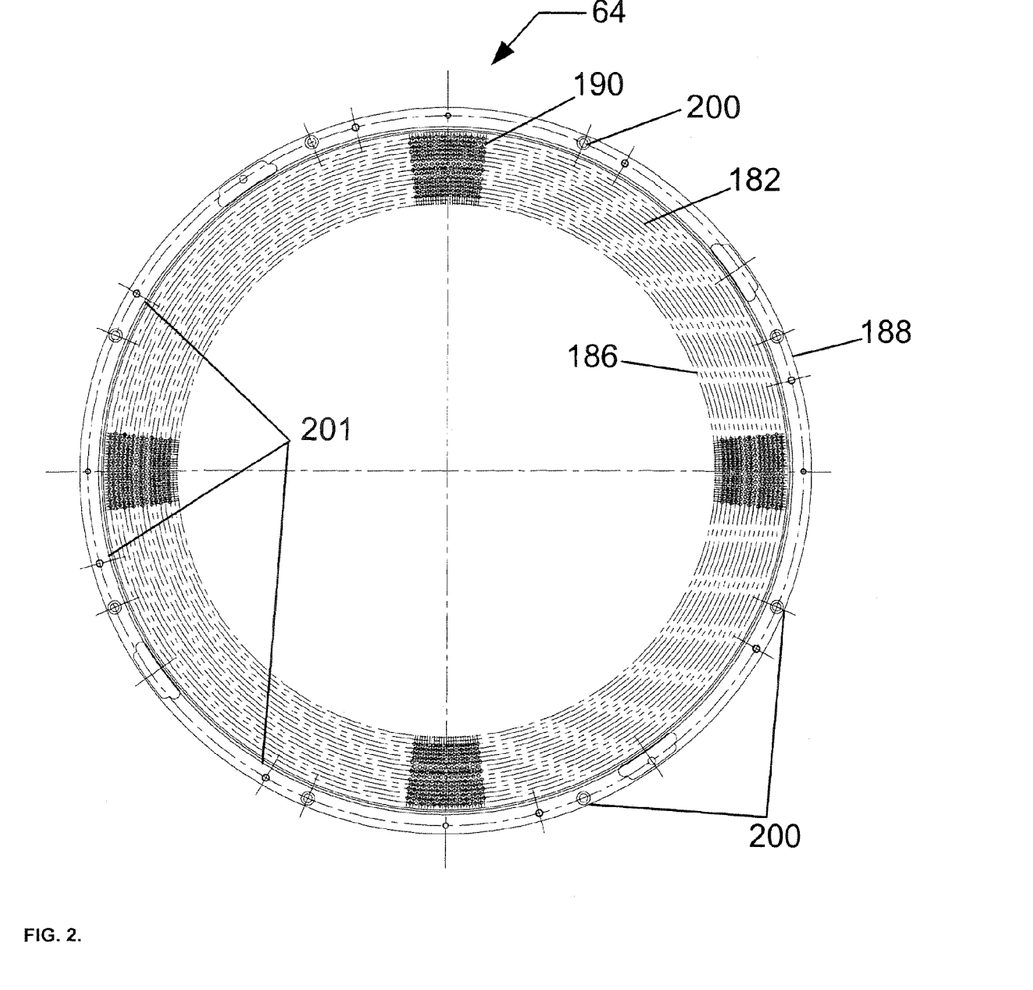
FIG. 2 shows a plan view of a baffle plate for a plasma processing system according to an embodiment of the present invention.
Figure 3:
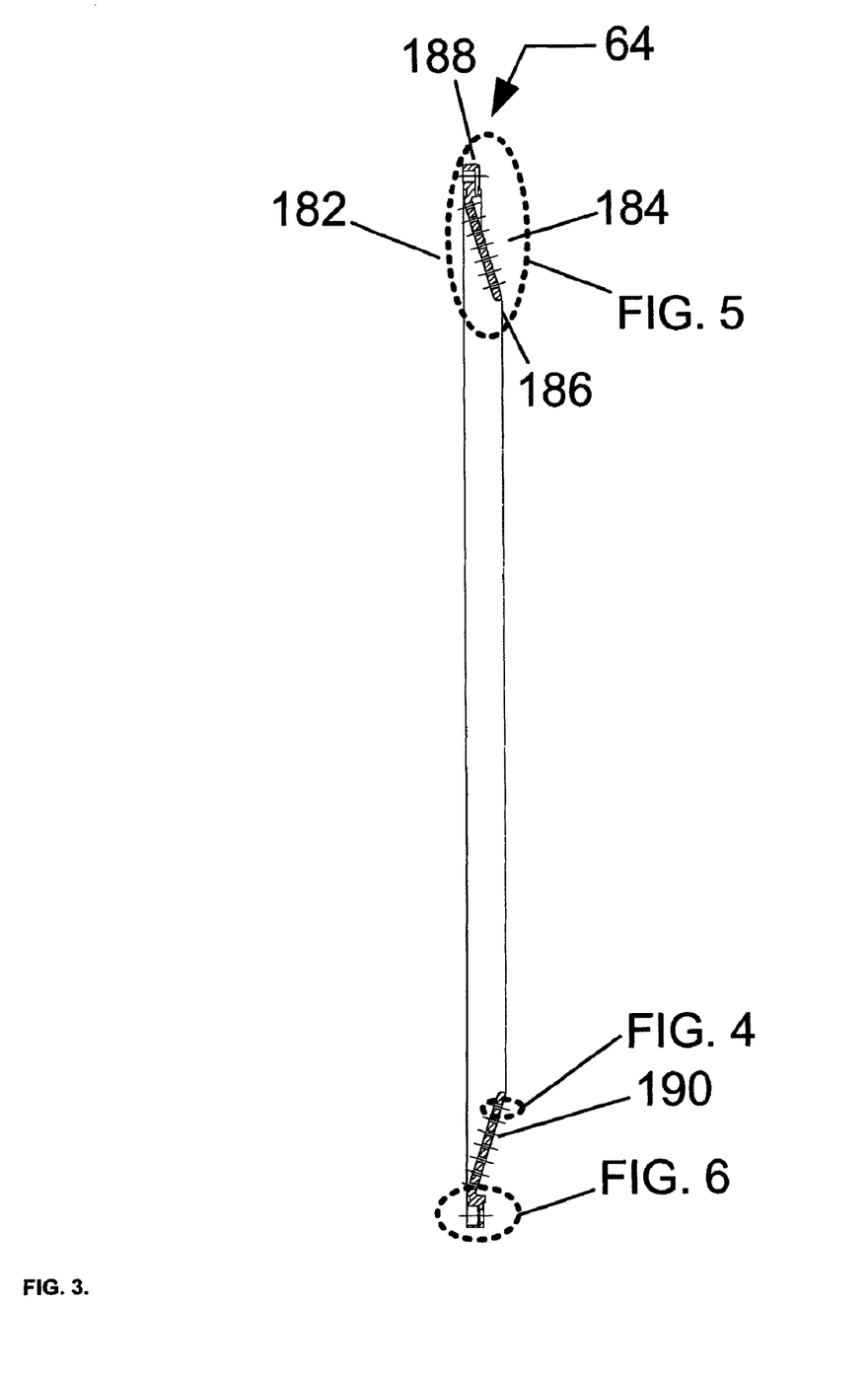
FIG. 3 shows a cross sectional view of a baffle plate for a plasma processing system according to an embodiment of the present invention.

Referring now to the illustrated embodiment depicted in FIG. 2 (plan view) and FIG. 3 (cross-sectional plan view), baffle plate 64 can form a canted ring comprising an upper surface 182, a lower surface 184, an inner radial edge 186, and an outer radial edge 188. The baffle plate 64 can further comprise at least one passageway 190 coupled to the upper surface 182 and to the lower surface 184, and configured to permit the flow of gas therethrough.

Figure 4:
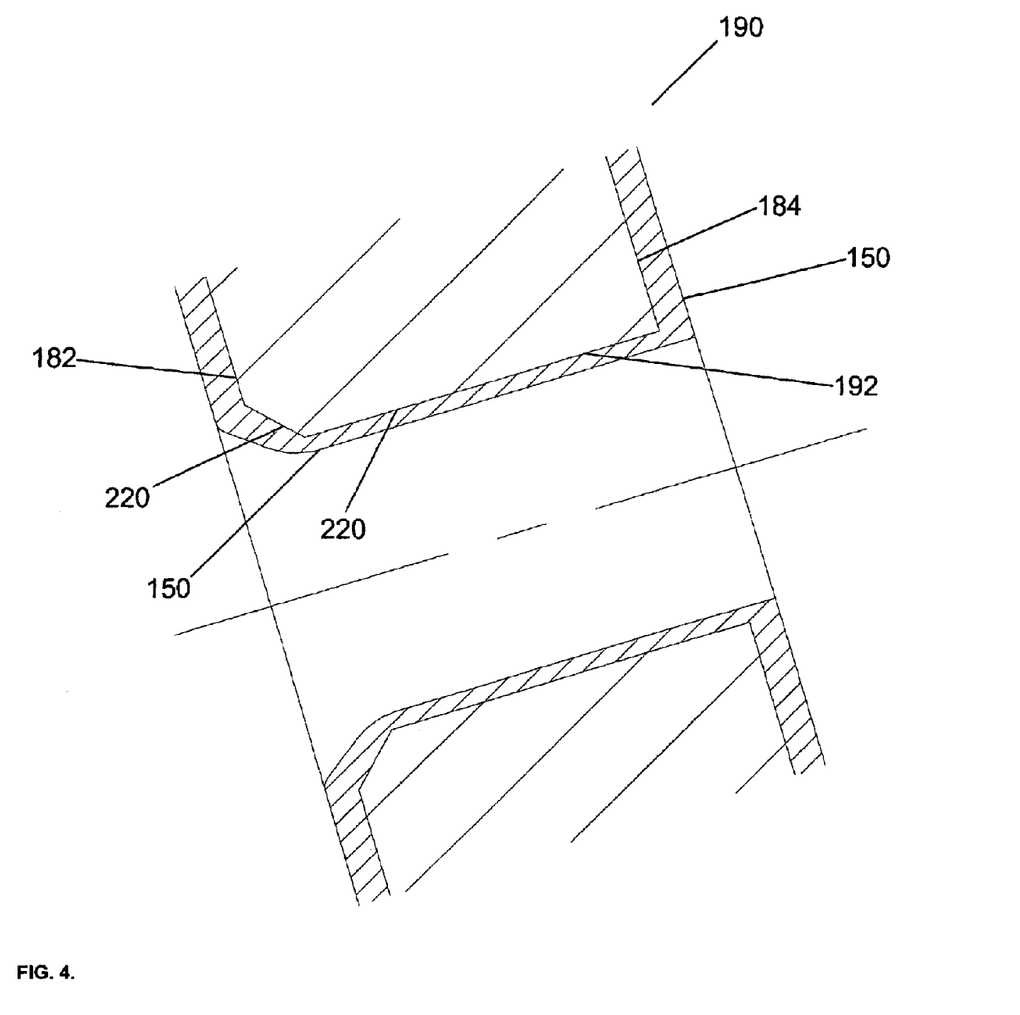
FIG. 4 shows an expanded cross sectional view of one passageway formed within a baffle plate for a plasma processing system according to an embodiment of the present invention.

FIG. 4 provides an expanded view of one of the passageways 190, wherein the expanded view provides a cross-sectional view of the passageway 190. Each passageway 190 comprises an inner passageway surface 192 contiguous with the upper surface 182 and the lower surface 184 of the baffle plate 64. For example, inner passageway surface 192 can comprise at least one flat and/or curved surfaces. Additionally, for example, at least one passageway 190 can comprise a minimum length, dictated by the distance between the upper surface 182 and the lower surface 184 proximate each passageway 190, having a dimensional range from 1 to 50 mm. Desirably, the minimum length comprises a dimensional range from 1 to 10 mm, and preferably the minimum length is at least 2 mm.

Figure 5:
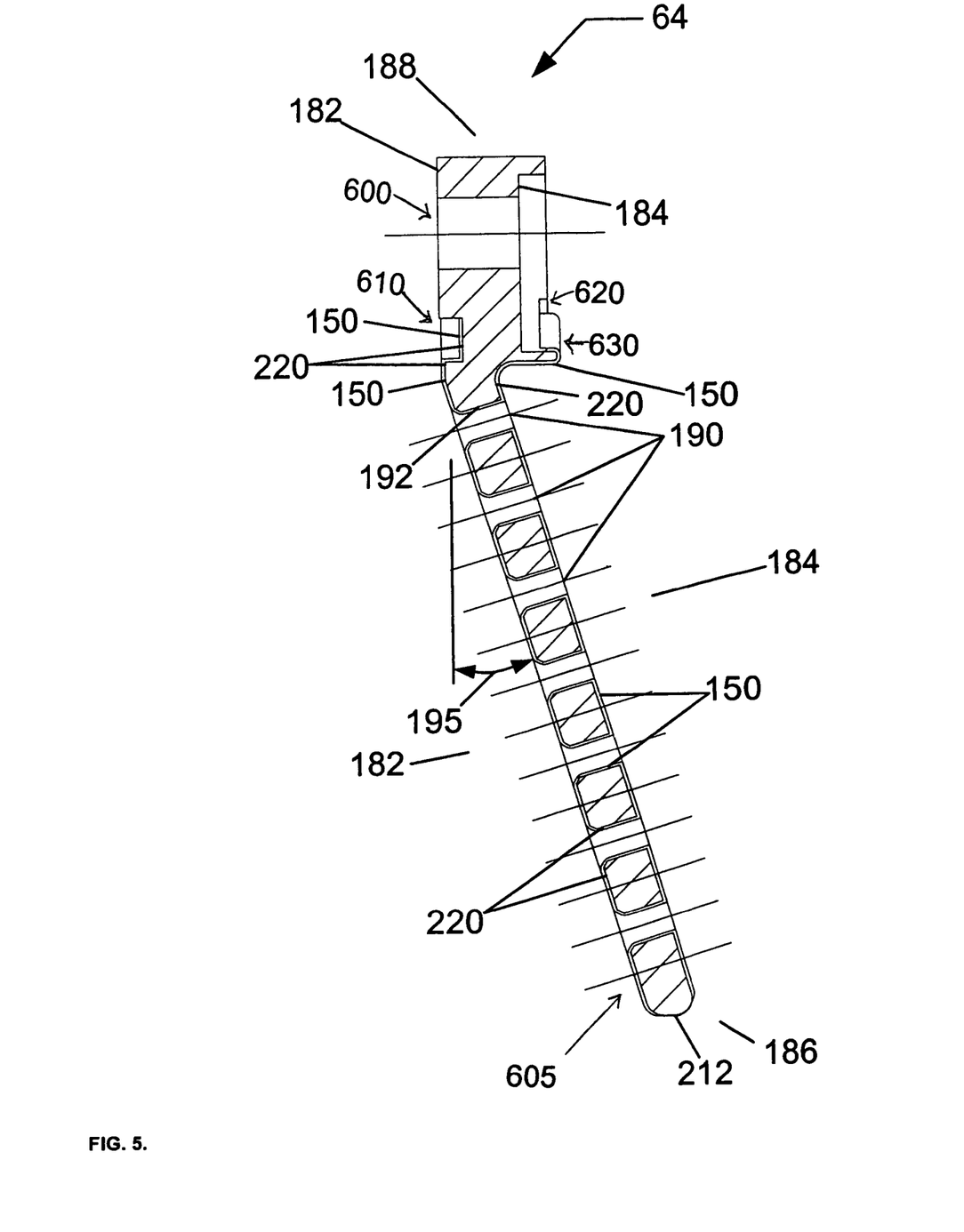
FIG. 5 shows an expanded cross sectional view of a baffle plate for a plasma processing system according to an embodiment of the present invention.

FIG. 5 provides an exemplary cross-sectional view of baffle plate 64 depicting several passageways 190 in cross-section. In the illustrated embodiment shown in FIG. 2 and FIG. 5, the passageways 190 can comprise at least one orifice that is aligned in a radial direction. Alternately, the at least one orifice can be aligned in an azimuthal direction. In an alternate embodiment of the present invention, the at least one passageway 190 can be slanted and, therefore, aligned partially in a radial direction and an azimuthal direction. In an alternate embodiment, the at least one passageway 190 can comprise a combination of alignment methodologies thereof. Alternatively, the at least passageway 190 can include at least one slot.

Referring still to FIG. 5, inner radial edge 186 comprises an inner edge surface 212 contiguous with the upper surface 182 and the lower surface 184 of baffle plate 64. For example, the inner edge surface 212 can comprise a curved and/or flat surface.

Referring still to FIG. 5, baffle plate 64 can comprise surfaces 182 and 184, wherein at least one of the upper surface 182 and the lower surface 184 is inclined at an angle 195. For example, the angle 195 of inclination for each surface can be the same as shown in FIG. 5. Additionally, for example, the angle 195 can range from 0 to 90 degrees. Desirably, the angle 195 ranges from 0 to 60 degrees; and preferably, the angle 195 ranges from 0 to 45 degrees. In the embodiment of FIG. 5, the baffle plate 64 includes a first section 600 and a second section 605 inclined with respect to the first section. An upper surface of the first section includes a recess 610. As also seen in FIG. 5, a lower surface of the first section includes a recess 620 and a protrusion 630.

Figure 6:
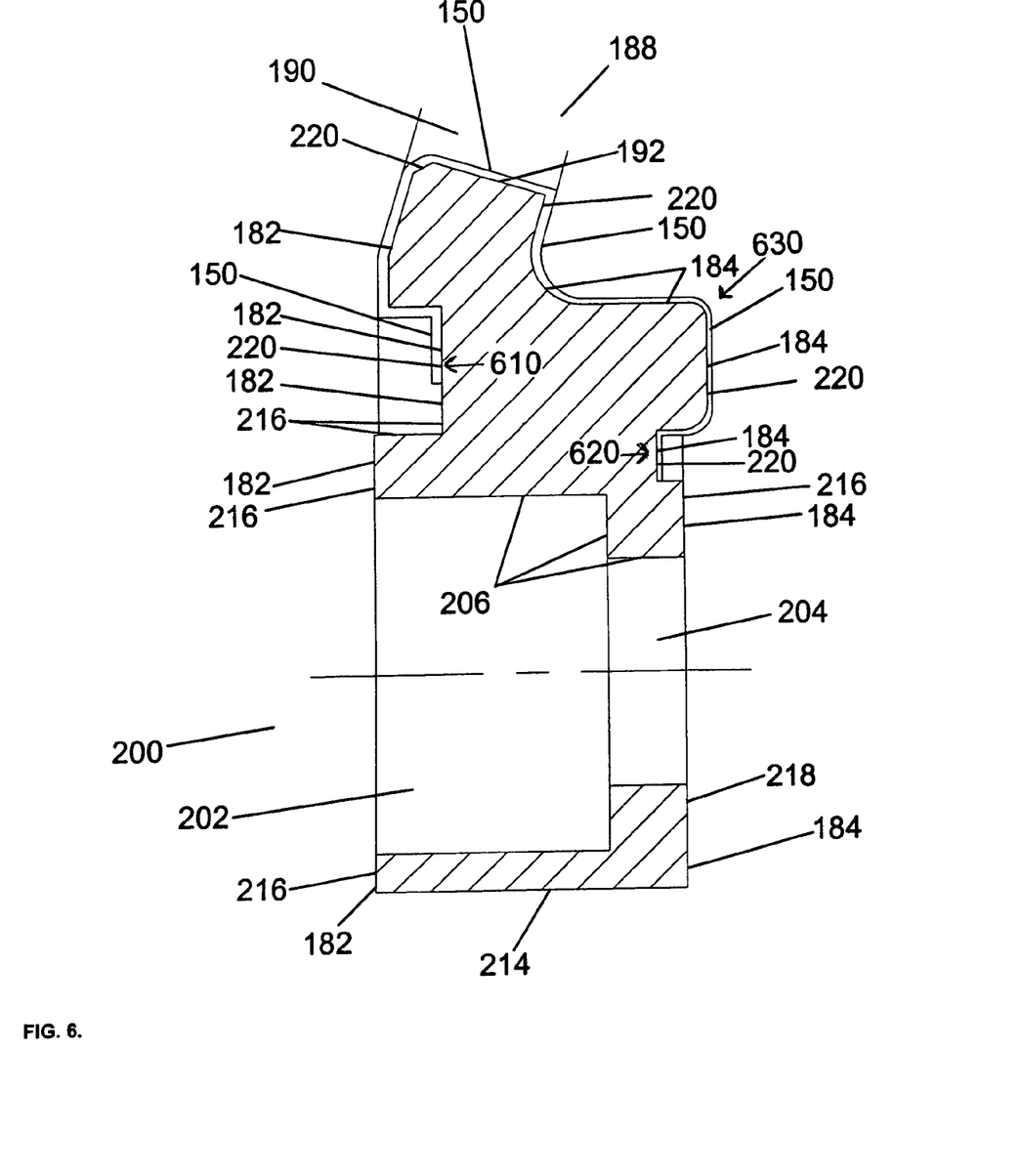
FIG. 6 presents an expanded view of an outer radial edge of a baffle plate for a plasma processing system according to an embodiment of the present invention.

FIG. 6. illustrates an expanded cross sectional view of the outer radial edge 188 of baffle plate 64. As depicted in FIG. 6 and FIG. 2, baffle plate 64 can, for example, further comprise a plurality of fastening receptors 200, each fastening receptor 200 can be coupled to the upper surface 182 and the lower surface 184, and configured to receive fastening devices (not shown) (such as bolts) to couple baffle plate 64 to the plasma processing system 1. The fastening receptors 200 can comprise an entrant cavity 202, an exit through-hole 204, and an inner receptor surface 206. For example, the number of fastening receptors 200 formed within baffle plate 64 can range from 0 to 100. Desirably, the number of fastening receptors 200 can range from 5 to 20; and, preferably, the number of fastening receptors 200 equals 8.

Referring still to FIG. 6, the outer radial edge 188 can further comprise an outer edge surface 214, a first mating surface 216, and a second mating surface 218. The outer edge surface 214 can be coupled to the upper surface 182 and the lower surface 184 of baffle plate 64. Upper surface 182 can comprise the first mating surface 216 that can be configured to mate with plasma processing system 1. Lower surface 184 can comprise the second mating surface 218 that can be configured to mate with plasma processing system 1. Additionally, for example, the outer radial edge 188 can comprise a thickness, dictated by the distance between the first mating surface 216 and the second mating surface 218 proximate the outer edge surface 214, having a dimensional range from 1 to 50 mm. Desirably, the thickness comprises a dimensional range from 1 to 10 mm, and preferably the thickness is at least 5 mm.

Referring now to FIGS. 2 through 6, the baffle plate 64 further comprises a protective barrier 150 formed on a plurality of exposed surfaces 220 of the baffle plate 64. In an embodiment of the present invention, the exposed surfaces 220 can comprise the upper surface 182 of baffle plate 64 excluding the first mating surface 216; the lower surface 184 of baffle plate 64 excluding the second mating surface 218; the inner edge surface 212; and the inner passageway surface 192 coupled to the upper surface 182 and the lower surface 184. In one embodiment, the entrant cavity 202 surfaces and the through-hole surfaces are exposed surfaces. Alternately, one or more of these surfaces can comprise a protective barrier. Alternately, the exposed surfaces comprise all surfaces on the baffle plate 64. As seen in the embodiment of FIG. 6, the protective barrier 150 is provided on at least a portion of the recess 610, recess 620 and protrusion 630.

In an embodiment of the present invention, the protective barrier 150 can comprise a compound including an oxide of aluminum such as $Al_2O_3$. In another embodiment of the present invention, the protective barrier 150 can comprise a mixture of $Al_2O_3$ and $Y_2O_3$. In another embodiment of the present invention, the protective barrier 150 can comprise at least one of a III-column element (column III of periodic table) and a Lanthanon element. In another embodiment of the present invention, the III-column element can comprise at least one of Yttrium, Scandium, and Lanthanum. In another embodiment of the present invention, the Lanthanon element can comprise at least one of Cerium, Dysprosium, and Europium. In another embodiment of the present invention, the compound forming protective barrier 150 can comprise at least one of Yttria ($Y_2O_3$), $Sc_2O_3$, $Sc_2F_3$, $YF_3$, $La_2O_3$, $CeO_2$, $Eu_2O_3$, and $Dy_2O_3$.

In an embodiment of the present invention, the protective barrier 150 formed on baffle plate 64 comprises a thermal sprayed coating having a minimum thickness, wherein the minimum thickness can be allowed to vary across the plurality of exposed surfaces 220. In other words, the specified thickness can be variable across the exposed surfaces 220. For example, the minimum thickness can be constant over a first portion of the exposed surfaces 220 and variable over a second portion of the exposed surfaces 220. For example, a variable thickness can occur on a curved surface, on a corner, or in a hole. The minimum thickness ranges from 0 micron to 550 micron. Desirably, the minimum thickness ranges from 50 micron to 250 micron; and, preferably, the minimum thickness ranges from 150 micron to 250 micron.

Additionally, as shown in FIG. 2, baffle plate 64 can, for example, further comprise a plurality of mounting through-holes 201. Each mounting through-hole 201 can be coupled to the upper surface 182 and the lower surface 184, and configured to receive fastening devices (not shown) (such as bolts) to couple baffle plate 64 to at least one of the plasma processing chamber 10 and the deposition shield 14. For example, the number of mounting through-holes 201 formed within baffle plate 64 can range from 0 to 100. Desirably, the number of mounting through-holes 201 ranges from 5 to 20; and, preferably, the number of mounting through-holes 201 is at least 10.

Figure 7:
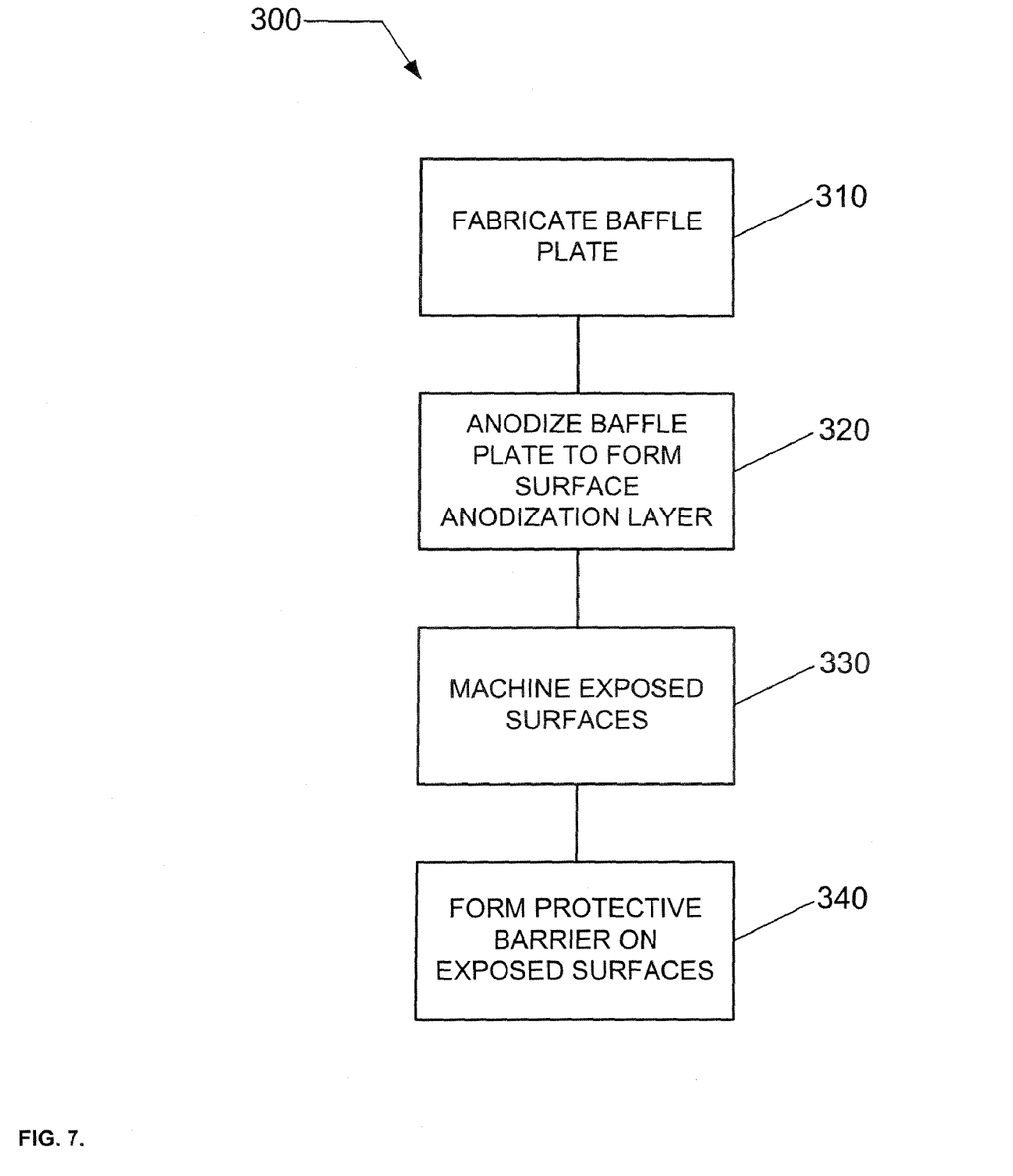
FIG. 7 presents a method of producing a baffle plate for a plasma processing system according to an embodiment of the present invention.

FIG. 7 presents a method of producing the baffle plate 64 in the plasma processing system described in FIG. 1 according to an embodiment of the present invention. A flow diagram 300 begins in 310 with fabricating the baffle plate 64 (e.g., a baffle plate having the characteristics of the plate described with reference to FIGS. 2-6). Fabricating the baffle plate can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The baffle plate can, for example, be fabricated from aluminum.

In 320, the baffle plate is anodized to form a surface anodization layer. For example, when fabricating the baffle plate from aluminum, the surface anodization layer comprises aluminum oxide ($Al_2O_3$). Methods of anodizing aluminum components are well known to those skilled in the art of surface anodization.

In 330, the surface anodization layer is removed from the exposed surfaces 220 using standard machining techniques. During the same machining step, or during a separate machining step, other surfaces (e.g., the first mating surface of the upper surface, and the second mating surface of the lower surface) may also be machined (e.g., to produce a flat or bare surface that provides at least one of a good mechanical or electrical contact at the machined surface).

In 340, the protective barrier 150 is formed on the exposed surfaces 220. A protective barrier 150 comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

Figure 8:
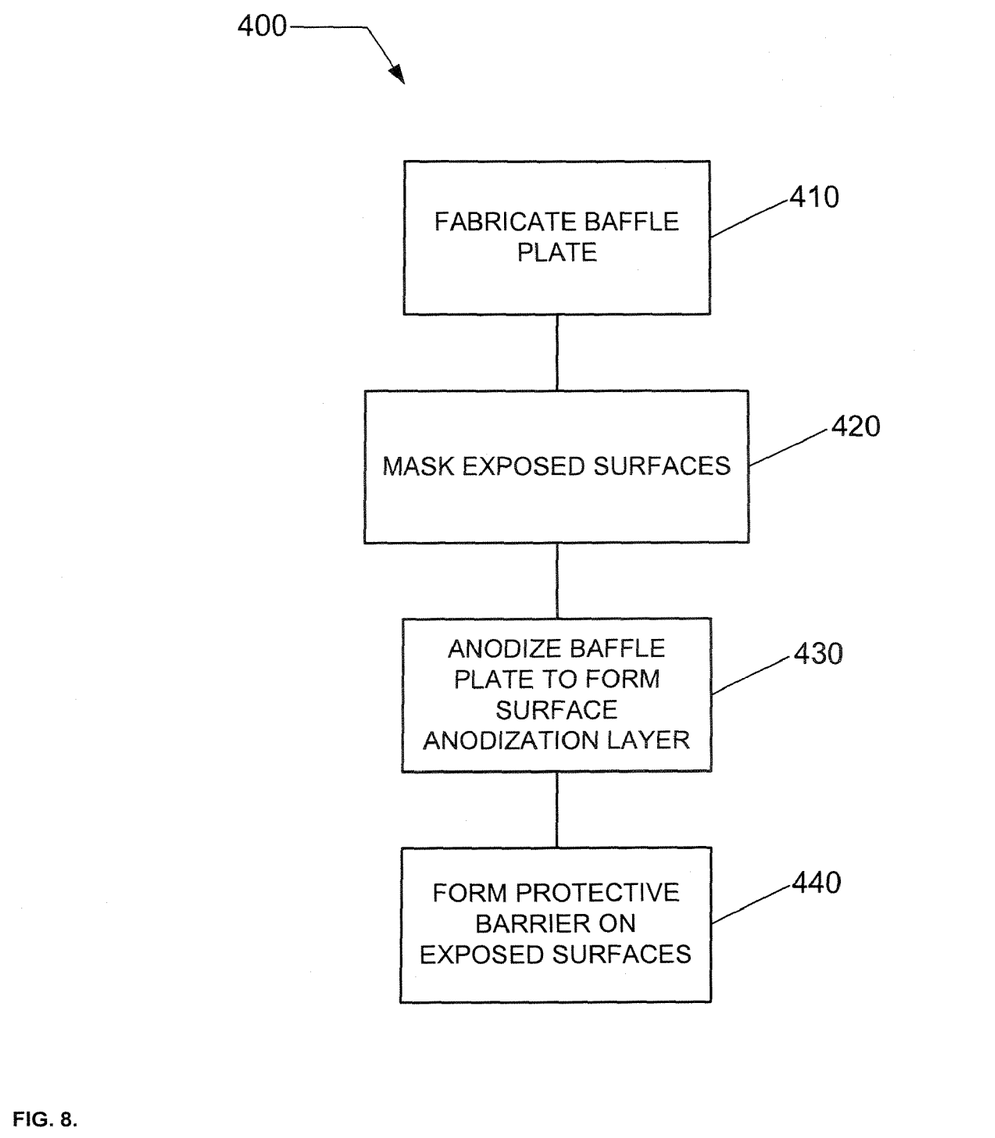
FIG. 8 presents a method of producing a baffle plate for a plasma processing system according to another embodiment of the present invention.

FIG. 8 presents a method of producing the baffle plate in the plasma processing system described in FIG. 1 according to another embodiment of the present invention. A flow diagram 400 begins in 410 with fabricating the baffle plate 64 (e.g., a baffle plate having the characteristics of the plate described with reference to FIGS. 2-6). Fabricating the baffle plate can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The baffle plate can, for example, be fabricated from aluminum.

In 420, exposed surfaces 220 are masked to prevent the formation of a surface anodization layer thereon. Techniques for surface masking and unmasking are well known to those skilled in the art of surface coatings and surface anodization. During the same masking step, or during a separate masking step, other surfaces (e.g., the first mating surface of the upper surface, and the second mating surface of the lower surface) may also be masked (e.g., to maintain a flat or bare surface that provides at least one of a good mechanical or electrical contact at the machined surface).

In 430, the baffle plate is anodized to form a surface anodization layer on the remaining unmasked surfaces. For example, when fabricating the baffle plate from aluminum, the surface anodization layer can comprise aluminum oxide ($Al_2O_3$). Methods of anodizing aluminum components are well known to those skilled in the art of surface anodization.

In 440, the exposed surfaces 220 are unmasked, and the protective barrier 150 is formed on the exposed surfaces 220. A protective barrier comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

Figure 9:
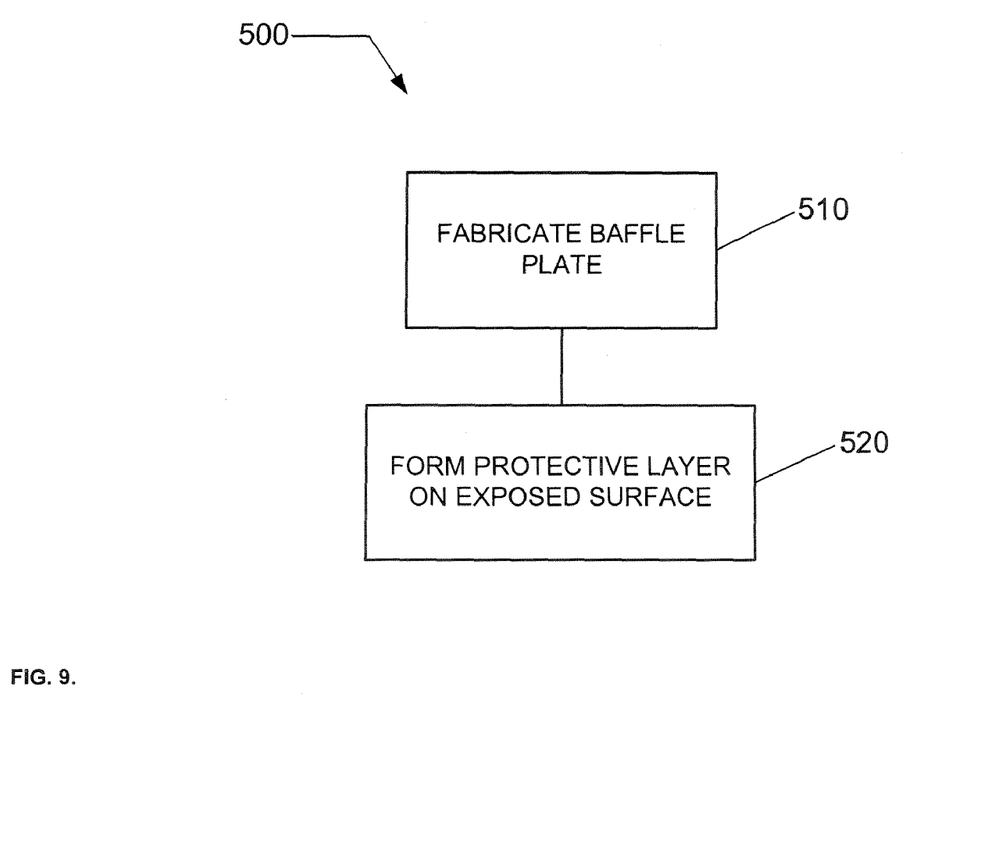
FIG. 9 presents a method of producing a baffle plate for a plasma processing system according to another embodiment of the present invention.

FIG. 9 presents a method of producing the baffle plate in the plasma processing system described in FIG. 1 according to another embodiment of the present invention. A flow diagram 500 begins in 510 with fabricating the baffle plate 64 (e.g., a baffle plate having the characteristics of the plate described with reference to FIGS. 2-6). Fabricating the baffle plate can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The baffle plate can, for example, be fabricated from aluminum.

In 520, a protective barrier 150 is formed on exposed surfaces 220 of the baffle plate 64. A protective barrier comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

The processes of forming a protective barrier 150 on the exposed surfaces 220, described with reference to FIGS. 7-9 can be modified to utilize a combination of machining and masking. In such a modified process, at least one exposed surface is masked to prevent formation of the anodization layer thereon while other exposed surfaces are anodized. The exposed surfaces that are unmasked are then machined, and the exposed surfaces that were masked are unmasked. The protective barrier 150 can then be formed on all the exposed surfaces. As described above, additional surfaces that are not exposed surfaces may also be machined during the method (e.g., in order to provide a better mechanical or electrical contact than would be formed with the anodization layer thereon.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A baffle plate for a plasma processing system comprising:
    a canted ring including a first section and a second section, wherein said first section is radially outside of said second section and the canted ring includes an outer radial edge associated with said first section and an inner radial edge associated with said second section;
    said first section including substantially planar upper and lower surfaces;
    said second section including substantially planar upper and lower surfaces, and wherein said upper and lower surfaces of said second section extend at a non-zero angle with respect to said upper and lower surfaces of said first section such that said second section is inclined with respect to said first section and wherein said second section includes a plurality of passageways extending therethrough from the upper surface of the second section to the lower surface of the second section;
    at least one of a recess and a protrusion provided on said first section; and
    a protective barrier provided on at least a portion of said second section.

2. The baffle plate as recited in claim 1, wherein said first section includes a fastening receptor extending therethrough, and wherein said at least one of a recess and a protrusion is disposed radially between said fastening receptor and said second section.

3. The baffle plate as recited in claim 2, wherein the first section of the baffle plate includes both a recess and a protrusion.

4. The baffle plate as recited in claim 3, wherein each of the recess and the protrusion is positioned radially between said fastening receptor and said second section.

5. The baffle plate as recited in claim 4, wherein said recess is recessed from said substantially planar upper surface of said first section and said protrusion protrudes from said substantially planar lower surface of said first section, the baffle plate further including another recess which is recessed from said substantially planar lower surface of said first section.

6. The baffle plate as recited in claim 5, wherein said protective barrier is provided on at least a portion of said recess and said another recess.

7. The baffle plate as recited in claim 6, wherein portions of said baffle plate that are radially outside of said recess and said another recess do not have the protective barrier thereon.

8. The baffle plate as recited in claim 6, wherein said protrusion is positioned between said another recess and said second section.

9. The baffle plate as recited in claim 3, wherein said protective barrier is provided on only a portion of said recess.

10. The baffle plate as recited in claim 9, wherein the recess includes first and second sidewalls coupling said first substantially planar upper surface to a bottom surface of said recess, wherein said protective barrier is provided on at least one of said first and second sidewalls.

11. The baffle plate as recited in claim 1, wherein said second section is inclined at an angle ranging from 0 to 60 degrees with respect to said first section.

12. The baffle plate as recited in claim 1, wherein said protective barrier is a coating which comprises a compound containing at least one of a group III element and a Lanthanon element.

13. The baffle plate as recited in claim 12, wherein said group III element comprises at least one of Yttrium, Scandium, and Lanthanum.

14. The baffle plate as recited in claim 12, wherein said Lanthanon element comprises at least one of Cerium, Dysprosium, and Europium.

15. The baffle plate as recited in claim 1, further comprising at least one uncoated surface not having said protective barrier thereon.

16. The baffle plate as recited in claim 15, wherein said at least one uncoated surface includes an anodized surface.

17. The baffle plate as recited in claim 15, wherein said at least one uncoated surface comprises a bare surface not having said protective barrier and not having an anodized layer thereon.

18. The baffle plate of claim 1, wherein said protective barrier is a coating which comprises yttrium.

19. The baffle plate of claim 18, wherein said protective barrier is a coating which comprises $YF_3$.

20. The baffle plate of claim 1, wherein said protective barrier is a coating which comprises dysprosium.

21. The baffle plate of claim 20, wherein said protective barrier is a coating which comprises $Dy_2O_3$.

22. The baffle plate of claim 20, wherein said protective barrier is a coating which comprises an oxide of dysprosium.

23. A baffle plate comprising:
    a canted ring including a first section and a second section disposed radially inside of said first section;
    wherein said first section includes upper and lower surfaces, said first section further including a first recess on said upper surface, a second recess on said lower surface and a protrusion on said lower surface, wherein said protrusion is positioned radially between said second recess and said second section;
    wherein said second section extends at a non-zero angle with respect to said first section such that said second section is inclined with respect to said first section, and wherein said second section includes a plurality of passageways extending therethrough; and
    a protective barrier provided on at least a portion of said second section, wherein the protective barrier is a coating which comprises yttrium or dysprosium or a combination thereof.

24. The baffle plate of claim 23, wherein said protective barrier is a coating which comprises $YF_3$.

25. The baffle plate of claim 23, wherein said protective barrier is a coating which comprises $Dy_2O_3$.

26. The baffle plate of claim 23, wherein said protective barrier is a coating which comprises an oxide of dysprosium.

* * * * *